United States Patent
Chen et al.

(10) Patent No.: US 9,733,568 B2
(45) Date of Patent: Aug. 15, 2017

(54) TOOL AND METHOD OF DEVELOPING

(71) Applicant: Taiwan Semiconductor Manufacturing CO., LTD., Hsinchu (TW)

(72) Inventors: Yi-Rem Chen, Taipei (TW); Ming-Shane Lu, Zhubei (TW); Chung-Hao Chang, Hsinchu (TW); Jui-Ping Chuang, Hsinchu (TW); Li-Kong Turn, Taichung (TW); Fei-Gwo Tsai, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 135 days.

(21) Appl. No.: 14/189,169

(22) Filed: Feb. 25, 2014

(65) Prior Publication Data
US 2015/0241786 A1    Aug. 27, 2015

(51) Int. Cl.
*B08B 9/34* (2006.01)
*G03F 7/30* (2006.01)
*H01L 21/67* (2006.01)

(52) U.S. Cl.
CPC ........ *G03F 7/3021* (2013.01); *H01L 21/6715* (2013.01); *H01L 21/67051* (2013.01)

(58) Field of Classification Search
USPC .......................................... 430/331; 134/144
See application file for complete search history.

(56) References Cited

U.S. PATENT DOCUMENTS

| | | | |
|---|---|---|---|
| 2004/0115567 A1* | 6/2004 | Mandal | B05C 5/027 430/324 |
| 2008/0053487 A1* | 3/2008 | Goto | H01L 21/02057 134/32 |

* cited by examiner

*Primary Examiner* — Daborah Chacko Davis

(57) ABSTRACT

A tool and a method of developing are provided. In various embodiments, the method of developing includes rotating a wafer at a first rotating speed. The method further includes dispensing a developer solution onto the wafer at the first rotating speed by a first nozzle above the wafer, wherein the first nozzle moves back and forth along a path during dispensing the developer solution. The method further includes rotating the wafer at a second rotating speed to spread the developer solution onto the wafer uniformly. The method further includes dispensing a rinse solution onto the wafer at the second rotating speed by a second nozzle above the wafer.

19 Claims, 6 Drawing Sheets

TOOL AND METHOD OF DEVELOPING

BACKGROUND

When electronic products are becoming smaller in size and more intelligent with a high performance and a high reliability, requirements to integrated circuit (IC) fabrication techniques are accordingly increased for higher integration of IC. Among these IC fabrication techniques, photolithography process is an important technique used in forming selected circuit patterns on a substrate wafer. In general, a photoresist film can be deposited onto the substrate wafer during this process and thereafter pattern-exposed to lithographic equipment in order to transcribe a selected circuit pattern. The photoresist film is subsequently developed with a developer solution to obtain a resist pattern corresponding to the transcribed pattern. The developer solution is intended to remove the relatively more soluble areas of photoresist, and leave behind the remaining patterned image which basically serves as a mask for etching multiple thin film layers on the substrate wafer.

In order to form desired patterns of multiple thin film layers the on the substrate wafer, light-exposed photoresist film is then processed in a developing process with the developer solution and a rinse solution for washing out excess developer solution. For example, the developer solution is dispensed onto the substrate wafer. A developer solution film may be thus formed which is intended to have a relatively uniform thickness across the surface of the substrate wafer. The developer film is formed thereon so that the developer solution contacts with the resist-coated wafer in order to develop a light-exposed latent image. Upon completion of this step in the development process, the rinse solution can be supplied onto the surface of the wafer. By rotating the wafer at a relatively high speed, the rinse solution may be eventually scattered off to spin dry the surface of the wafer and complete the developing process. The developing process plays a very important role on forming desired patterns of multiple thin film layers the on the substrate wafer.

As aforementioned, since requirements to IC fabrication techniques are increased for higher integration of IC, precise formation of desired patterns of multiple thin film layers the on the substrate wafer is accordingly becoming challenging and difficult. Accordingly, improvements in tools and methods of the developing process continue to be sought.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
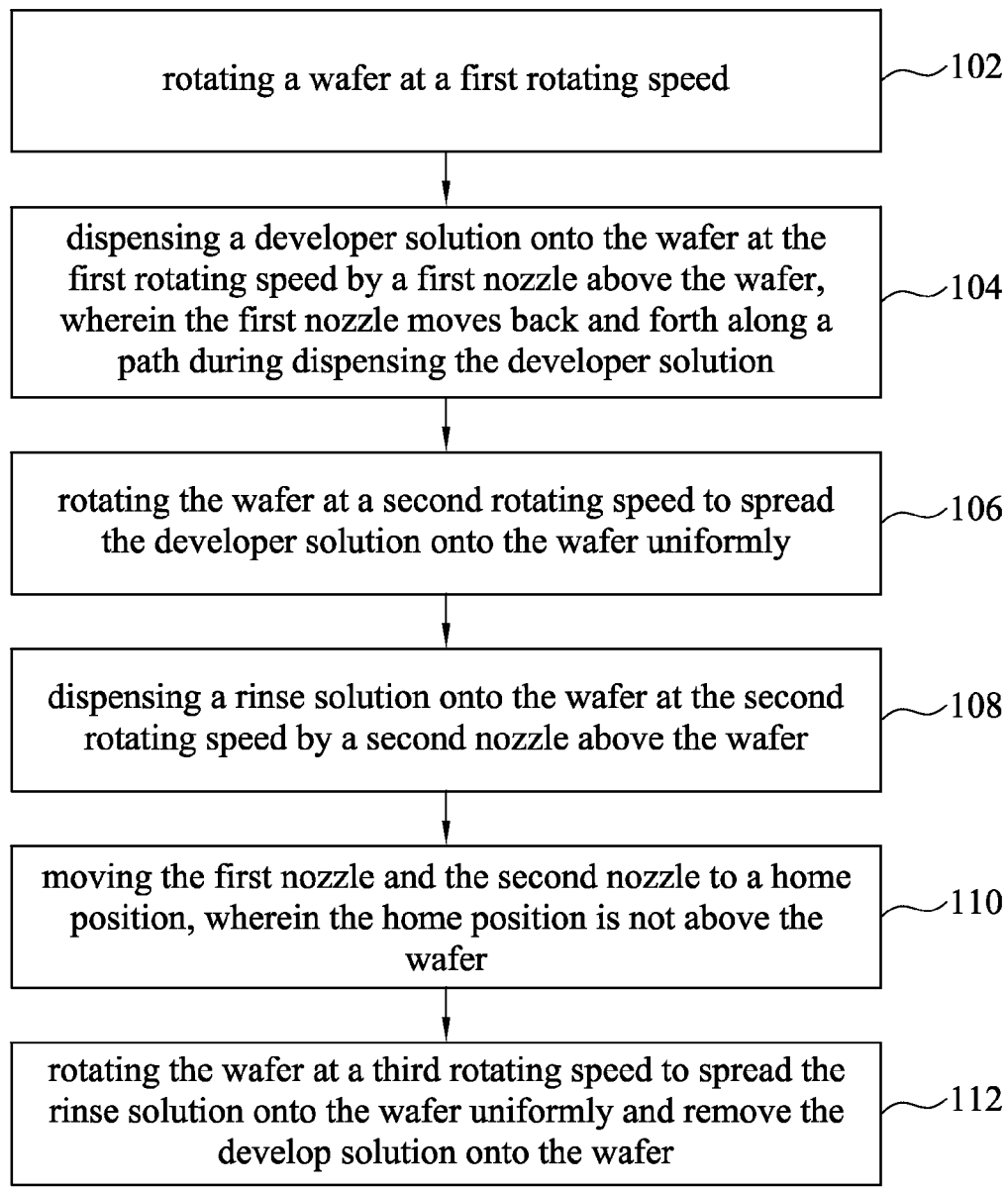
FIG. 1 is a flowchart illustrating a method of developing according to various embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The singular forms "a," "an" and "the" used herein include plural referents unless the context clearly dictates otherwise. Therefore, reference to, for example, a liner layer includes embodiments having two or more such liner layers, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

Because requirements to IC fabrication techniques are increased for higher integration of IC, precise formation of desired patterns of multiple thin film layers the on the substrate wafer accordingly becomes challenging and difficult. Since the developing process plays a very important role on forming desired patterns of multiple thin film layers the on the substrate wafer, the methods of developing according to various embodiments of the present disclosure provide better developing pattern uniformity within the substrate wafer and effectively reduce the defect counts which may be generated during the developing processes.

FIG. 1 is a flowchart illustrating a method 100 of developing according to various embodiments of the present disclosure. The method 100 begins with block 102 in which a wafer is rotated at a first speed. The method 100 continues with block 104 in which a developer solution is dispensed onto the wafer at the first rotating speed by a first nozzle above the wafer. It should be noticed that the first nozzle moves back and forth along a path during dispensing the developer solution. In various embodiments of the present disclosure, the path is a linear path corresponds to a radius of the wafer. In various embodiments of the present disclosure, the linear path ranges from a center of the wafer to two-thirds of the radius of the wafer. The method 100 also includes rotating the wafer at a second rotating speed to spread the developer solution onto the wafer uniformly as shown in block 106. The method 100 continues with block 108 in which a rinse solution is dispensed onto the wafer at the second rotating speed by a second nozzle above the wafer. In various embodiments of the present disclosure, the operation of dispensing the rinse solution is performed by the second nozzle moving back and forth along the linear path during dispensing the rinse solution. In various embodiments of the present disclosure, the method 100 further includes moving the first nozzle and the second nozzle to a home position as shown in block 110. It should be noticed that the home position is not above the wafer. The method 100 continues with block 112 in which the wafer is rotated at a third rotating speed to spread the rinse solution onto the wafer uniformly and remove the developer solution onto the wafer. In various embodiments of the present disclosure, the third rotating speed is greater than the first rotating speed. The details of the methods 100 are described in FIG. 3-7 and following paragraphs.

Figure 2:
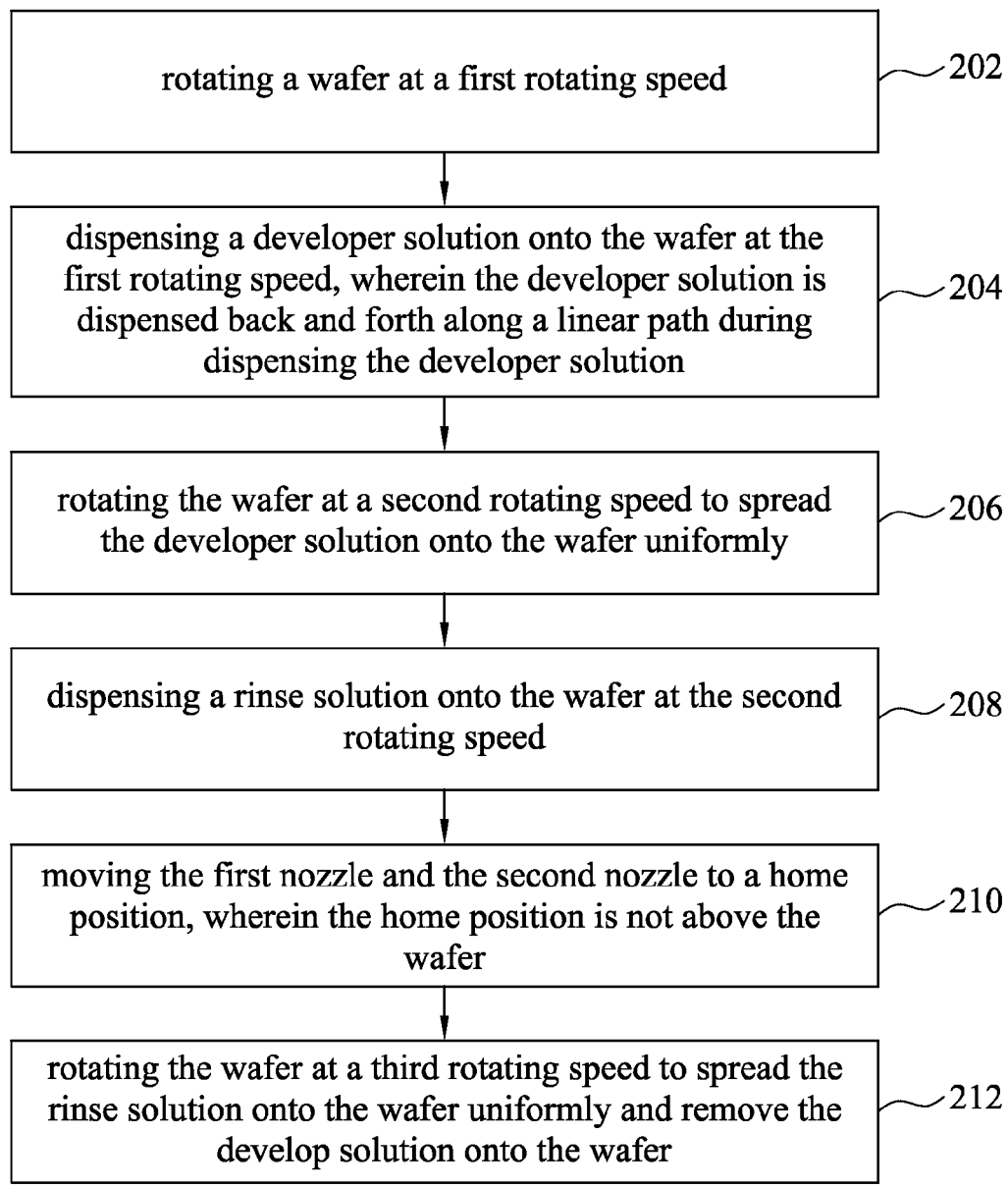
FIG. 2 is a flowchart illustrating a method of developing according to various embodiments of the present disclosure.

FIG. 2 is a flowchart illustrating a method 200 of developing according to various embodiments of the present disclosure. The method 200 begins with block 202 in which a wafer is rotated at a first speed. The method 200 continues with block 204 in which a developer solution is dispensed onto the wafer at the first rotating speed. It should be noticed that the developer solution is dispensed back and forth along a linear path during dispensing the developer solution. In various embodiments of the present disclosure, the linear path corresponds to a radius of the wafer, and the linear path ranges from a center of the wafer to two-thirds of the radius of the wafer. In various embodiments of the present disclosure, the operation of dispensing the developer solution is performed by a first nozzle moving back and forth along the linear path. The method 200 also includes rotating the wafer at a second rotating speed to spread the developer solution onto the wafer uniformly as shown in block 206. The method 200 continues with block 208 in which a rinse solution is dispensed onto the wafer at the second rotating speed. In various embodiments of the present disclosure, the operation of dispensing the rinse solution is performed by a second nozzle moving back and forth along the linear path. In various embodiments of the present disclosure, the method 200 further includes moving the first nozzle and the second nozzle to a home position as shown in block 210. It should be noticed that the home position is not above the wafer. The method 200 continues with block 212 in which the wafer is rotated at a third rotating speed to spread the rinse solution onto the wafer uniformly and remove the developer solution onto the wafer. The details of the methods 200 are described in FIG. 3-7 and following paragraphs.

Figure 3:
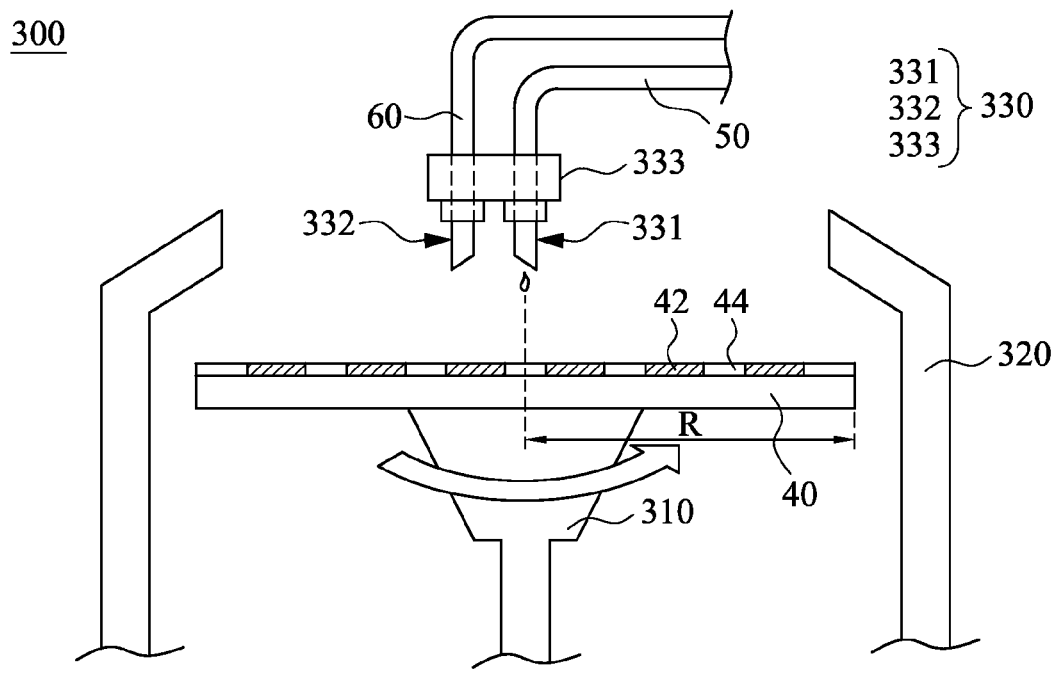
FIG. 3 is a schematic diagram of a tool for the methods of developing according to various embodiments of the present disclosure.

FIG. 3 is a schematic diagram of a tool 300 for the methods of developing according to various embodiments of the present disclosure. Referring to FIG. 3, the tool 300 includes a spin chuck 310, a bowl 320, and a dispensing system 330. The spin chuck 310 is configured to holding and rotating a wafer 40. The wafer 40 has a photo-resist layer including a light-exposed part 42 and a light-unexposed part 44. The wafer 40 is placed on the spin chuck 310 and held in place by vacuum. The spin chuck 310 is rotatable and could be also referred to by a variety of names such as vacuum chuck. As shown in FIG. 3, the spin chuck 310, for example, has a radius less than a radius R of the wafer 40. The wafer 40 is positioned on the spin chuck 310 such that the wafer 40 is resting in a level horizontal plane with the inactive surface, designated as the bottom, in contact with the spin chuck 310 and the opposite top surface is coated with desired solutions such as a developer solution 50 and a rinse solution 60 in following operations during the method of developing according to various embodiments of the present disclosure. The spin chuck 310 is, for example, powered and rotated by a motor. The spin chuck 310 holds the wafer 40 by vacuum to allow spinning of wafer 40. The environment of the spinning wafer 40 is, for example, 50% relative humidity. However, the present disclosure is not limited to it. The environment of the spinning wafer 40 could be properly optimized according to various materials of developer solution 50. The wafer 40 is enclosed by the bowl 320. The bowl 320 can be moved up or down to surround the wafer 40 and collect drain and exhaust generated during spin coating processes. For example, drain and exhaust pipes could be connected to the underside of the bowl 320 to collect and drain out excess developer solution 50 and a rinse solution 60 in following operations. The dispensing system 330 controls dispensing desired solutions such as the developer solution 50 and the rinse solution 60 in following operations of the methods of developing according to various embodiments of the present disclosure. As illustrated in FIG. 3, in various embodiments of the present disclosure, the dispensing system 330 includes a first nozzle 331, a second nozzle 332, and a moving arm 333. For example, the first nozzle 331 controls dispensing the developer solution 50, the second nozzle 332 controls dispensing the rinse solution 60, and the moving arm 333 controls movements of the first nozzle 331 and the second nozzle 332 while dispensing the developer solution 50 and the rinse solution 60. In other words, the supply of the developer solution 50 could be dispensed onto the wafer 40 from the first nozzle 331, and the supply of the rinse solution 60 could be dispensed onto the wafer 40 from the second nozzle 332. The first nozzle 331 and the second nozzle 332 can either be configured to simply drop a specific quantity onto the wafer 40 in the form of a puddle or to spray the desired quantity onto the wafer 40 in the form of a mist. However, the tool 300 of the present disclosure is not limited to it. In other various embodiments of the present disclosure, the dispensing system 330 further includes a third nozzle (not shown) and the nozzle arm 333. The third nozzle is configured to dispensing the developer solution 50 and the rinse solution 60 onto the wafer 40. In other words, dispensing of the developer solution 50 and the rinse solution 60 could be integrated into one nozzle to perform developing processes.

In some spin coating processes, the solution is dispensed prior to rotating the wafer, which is referred to as static dispense. However, in the methods according to various embodiments of the present disclosure, the developer solution 50 is dispensed on the spinning wafer 40, which is referred to as dynamic dispense. Referring to FIG. 3, the wafer 40 is rotated at a first rotating speed, and then the developer solution 50 is dispensed onto the wafer 40 at the first rotating speed. For example, the wafer 40 could be controlled by the spin chuck 310, and reach the first rotating speed. In various embodiments of the present disclosure, the first rotating speed ranges from about 500 rpm to about 1000 rpm. It should be noticed that dynamic dispensing requires lower rotating speed comparing to that of static dispensing, such that developer solution 50 according various embodiments of the present disclosure could uniformly contact with the photo-resist layer (including a light-exposed part 42 and a light-unexposed part 44) on the wafer 40. Besides, the risk of splash back during spin coating processes could be reduced since dynamic dispensing requires lower rotating speed comparing to that of static dispensing. Therefore, defect counts which caused by splash back during spin coating processes can be effectively reduced.

Figure 4:
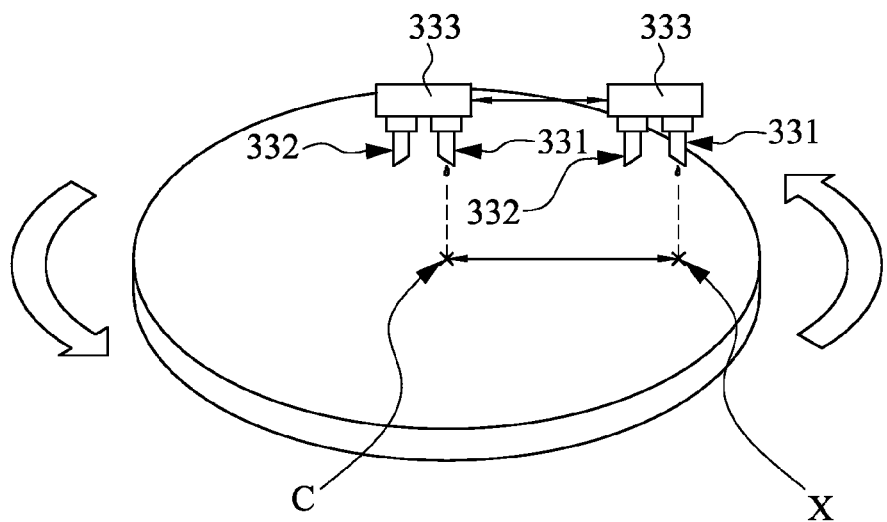
FIG. 4 is a schematic top-view of the methods of developing according various embodiments of the present disclosure.

FIG. 4 is a schematic top-view of the methods of developing according various embodiments of the present disclosure. As illustrated in FIG. 4, in the operation of dispensing the developer solution 50 onto the wafer 40 at the first rotating speed of method 100, the developer solution 50 is dispensed by the first nozzle 331 above the wafer 40. It should be noticed that the first nozzle 331 moves back and forth along a path 70 during dispensing the developer solution 50. For example, the first nozzle 331 could be moved by the moving arm 333 in a predetermined path during dispensing the developer solution 50 as illustrated in FIG. 3 and FIG. 4. Therefore, the developer solution 50 could be more uniformly spread upon overall photo-resist layer (including a light-exposed part 42 and a light-unexposed part 44) on the wafer 40. Accordingly, better developing pattern uniformity within the wafer 40 could be obtained. The path 70 could be linear, spiral, or any other proper shape to uniformly dispense the developer solution 50 onto the wafer 40. In various embodiments of the present disclosure, the path 70 is a linear path corresponds to a radius R of the wafer 40. As shown in FIG. 4, in various embodiments of the present disclosure, the linear path ranges from a center C of the wafer 40 to two-thirds of the radius X of the wafer 40. In other words, although the developer solution 50 is dispensed back and forth along the linear path corresponds to a radius R of the wafer 40. The developer solution 50 is not dispensed onto relatively edge of the wafer 40. Therefore, the risk of splash back during spin coating processes could be further reduced. Accordingly, defect counts which caused by splash back during spin coating processes can be effectively reduced.

Also as illustrated in FIG. 4, in the operation of dispensing the developer solution 50 onto the wafer 40 at the first rotating speed of method 200, the developer solution 50 is dispensed onto the wafer 40 at the first rotating speed. The developer solution 50 is dispensed back and forth along the linear path 70 during dispensing the developer solution. It should be noticed that developer solution 50 is dispensed back and forth along the path 70 during dispensing the developer solution 50. Therefore, the developer solution 50 could be more uniformly spread on overall photo-resist layer (including a light-exposed part 42 and a light-unexposed part 44) on the wafer 40. Accordingly, better developing pattern uniformity within the wafer 40 could be obtained. In various embodiments of the present disclosure, the operation of dispensing the developer solution 50 is performed by the first nozzle 331 moving back and forth along the linear path 70. As shown in FIG. 4, in various embodiments of the present disclosure, the linear path 70 corresponds to the radius R of the wafer 40, and the linear path 70 ranges from a center of the wafer 40 to two-thirds of the radius of the wafer 40 (from C to X). Therefore, the developer solution 50 is not dispensed onto relatively edge of the wafer 40 although the developer solution 50 is dispensed back and forth along the linear path corresponds to a radius R of the wafer 40. Accordingly, the risk of splash back during spin coating processes could be further reduced, and defect counts which caused by splash back during spin coating processes can be effectively reduced.

After the operation of dispensing the developer solution 50 onto the wafer 40 at the first rotating speed, the wafer 40 is rotated at a second rotating speed to spread the developer solution 50 onto the wafer 40 uniformly. For example, the second rotating speed could range from about 600 rpm to about 1000 rpm. However, the present disclosure is not limited thereto. To uniformly spread out the developer solution 50 onto the wafer 40, the second rotating speed could be further optimized into a rotating speed profile including several rotating speed intervals.

Figure 5:
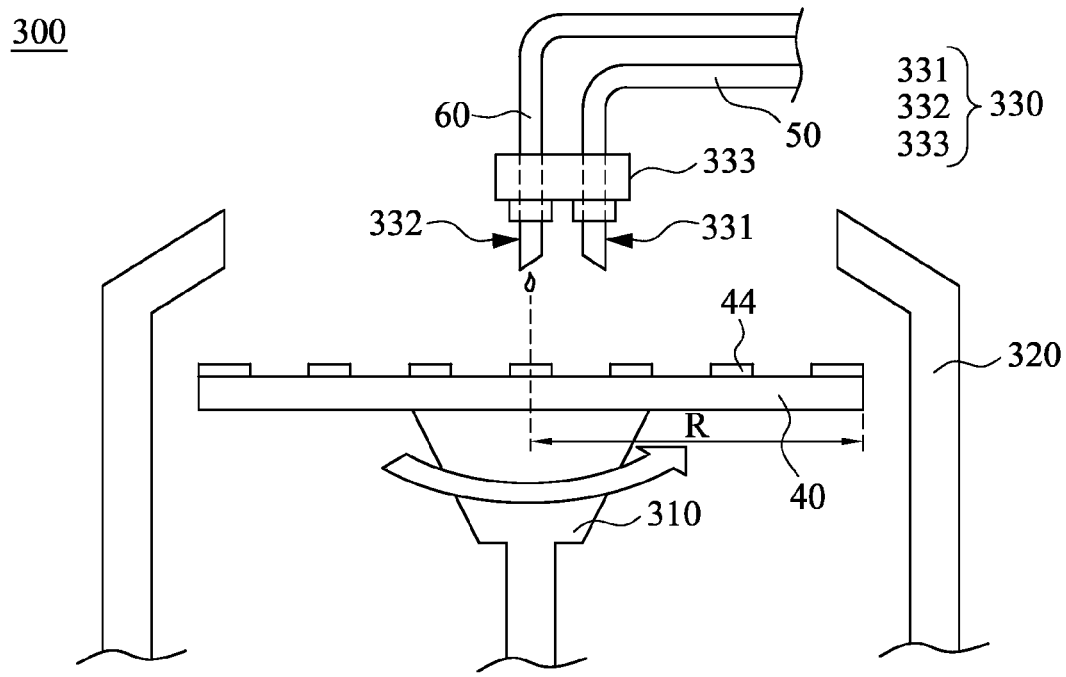
FIG. 5 is a schematic diagram shown in FIG. 3 in a subsequent stage according to various embodiments of the present disclosure.

FIG. 5 is a schematic diagram shown in FIG. 3 in a subsequent stage according to various embodiments of the present disclosure. As illustrated in FIG. 5, after the operation of rotating the wafer 40 at the second rotating speed, the rinse solution 60 is dispensed onto the wafer 40 at the second rotating speed by the second nozzle 332 above the wafer 40. For example, as shown in FIG. 5, the light-exposed part 42 of the photo-resist layer on the wafer 40 is reacted with the developer solution 50 dispensed in previous operation, and washed away from the wafer 40 by the rinse solution 60. The rinse solution 60 could be any proper solvent to effectively wash away the light-exposed part 42, which is reacted with the developer solution 50. In various embodiments of the present disclosure, the rinse solution 60 is deionized water. However, the present disclosure is not limited thereto. In other cases (if the photo-resist layer on the wafer 40 is made of negative type photo-resist), the light-unexposed part 42 of the photo-resist layer on the wafer 40 is reacted with the developer solution 50 dispensed in previous operation, and washed away from the wafer 40 by the rinse solution 60. The rinse solution 60 could be any proper solvent to effectively wash away the light-exposed part 42, which is reacted with the developer solution 50. In various embodiments of the present disclosure, the second rotating speed is less than the first rotating speed. Therefore, the risk of splash back of the rinse solution 60 during spin coating processes could be further reduced, and defect counts which caused by splash back during spin coating processes can be effectively reduced.

Figure 6:
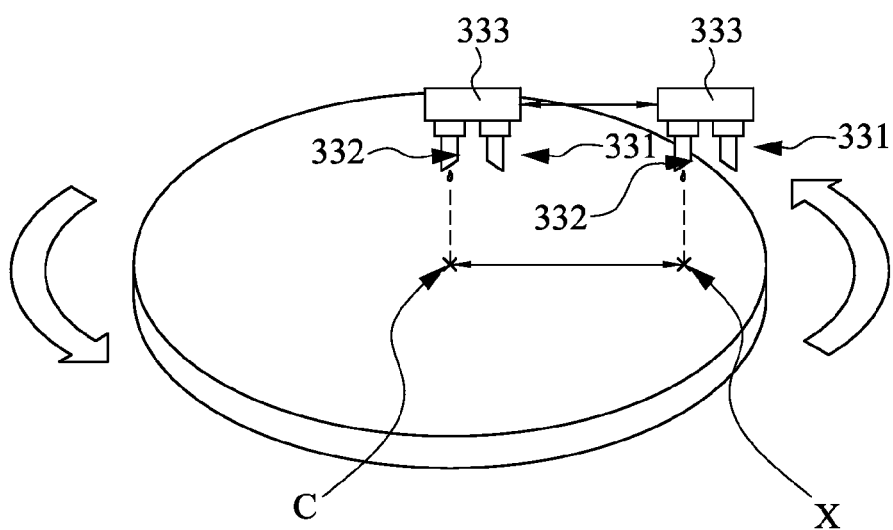
FIG. 6 is a schematic top-view of the methods of developing according various embodiments of the present disclosure.

FIG. 6 is a schematic top-view of the methods of developing according various embodiments of the present disclosure. As illustrated in FIG. 6, in the operation of dispensing the rinse solution 60 onto the wafer 40 at the second rotating speed of method 100, the rinse solution 60 is dispensed onto the wafer 40 at the second rotating speed by the second nozzle 332 above the wafer 40. The rinse solution 60 could be dispensed above the center C of the wafer 40, or dispensed along with a predetermined path. The predetermined path could be linear, spiral, or any other proper shape to uniformly dispense the rinse solution 60 onto the wafer 40. As shown in FIG. 6, in various embodiments of the present disclosure, the operation of dispensing the rinse solution 60 is performed by the second nozzle 332 moving back and forth along the linear path 70 during dispensing the rinse solution 60. Therefore, the rinse solution 60 could be more uniformly spread on overall photo-resist layer (including a light-exposed part 42 and a light-unexposed part 44) on the wafer 40. Accordingly, better developing pattern uniformity within the wafer 40 could be obtained. As shown in FIG. 6, in various embodiments of the present disclosure, the linear path 70 ranges from a center of the wafer to two-thirds of the radius of the wafer (from C to X). Therefore, the rinse solution 60 is not dispensed onto relatively edge of the wafer 40 although the rinse solution 60 is dispensed back and forth along the linear path corresponds to a radius R of the wafer 40. Accordingly, the risk of splash back during spin coating processes could be further reduced, and defect counts which caused by splash back during spin coating processes can be effectively reduced. Also as illustrated in FIG. 6, in the operation of dispensing the rinse solution 60 onto the wafer 40 at the second rotating speed of method 200, the rinse solution 60 is dispensed onto the wafer 40 at the second rotating speed. In various embodiments of the present disclosure, the operation of dispensing the rinse solution 60 is performed by the second nozzle 332 moving back and forth along the linear path 70.

Figure 7:
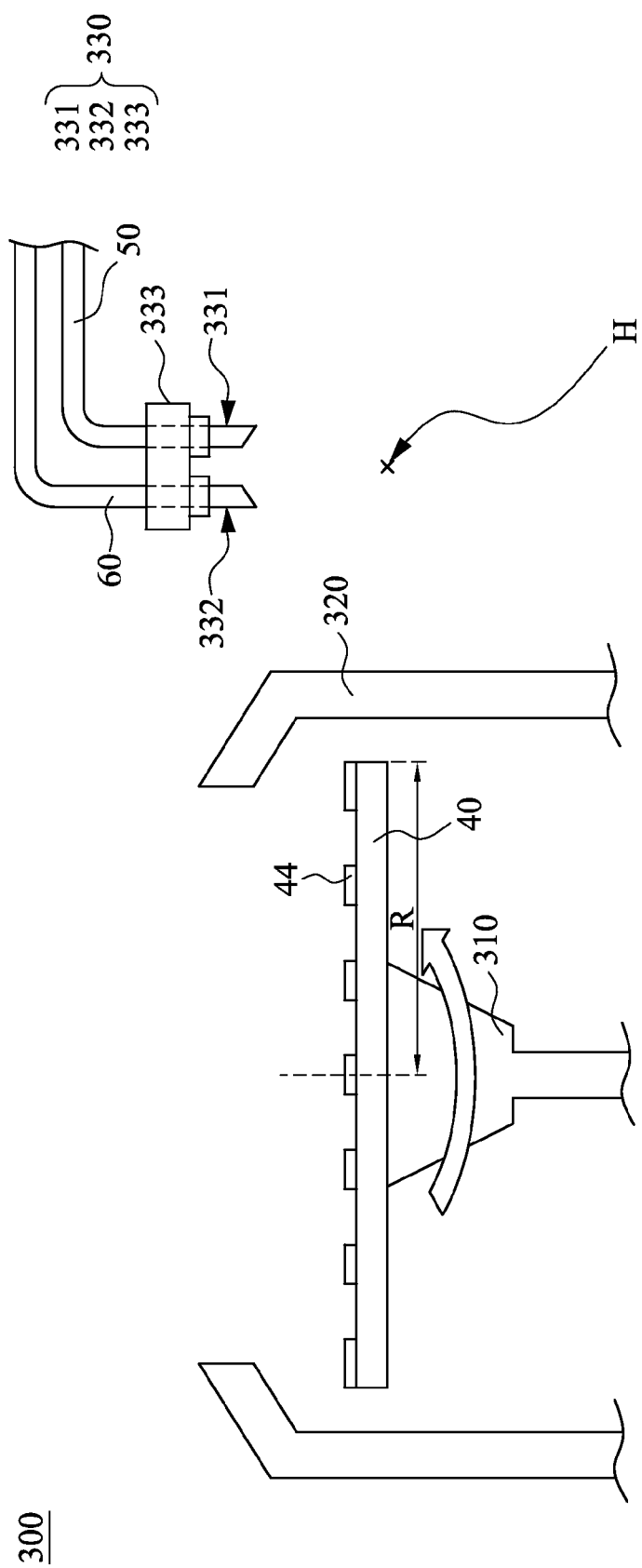
FIG. 7 is a schematic diagram shown in FIG. 5 in a subsequent stage according to various embodiments of the present disclosure.

FIG. 7 is a schematic diagram shown in FIG. 5 in a subsequent stage according to various embodiments of the present disclosure. As illustrated in FIG. 7, after the operation of dispensing the rinse solution 60, the methods further include moving the first nozzle 331 and the second nozzle 332 to a home position H. The home position is not above the wafer 40, and then the method 100 further includes rotating the wafer 40 at a third rotating speed to spread the rinse solution 60 onto the wafer 40 uniformly and remove the developer solution 50 onto the wafer 40.

Figure 8:
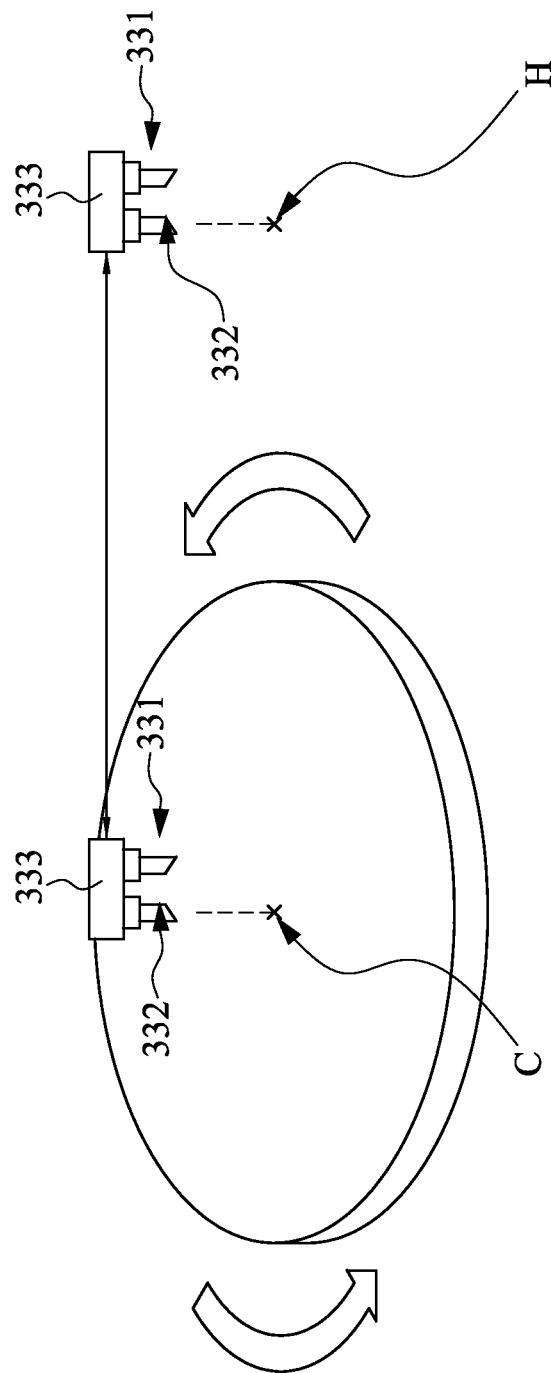
FIG. 8 is a schematic top-view of the methods of developing according various embodiments of the present disclosure.

FIG. 8 is a schematic top-view of the methods of developing according various embodiments of the present disclosure. As illustrated in FIG. 8, after the operation of dispensing the rinse solution 60, the methods of developing according various embodiments of the present disclosure further include moving the first nozzle 331 and the second nozzle 332 to the home position H. The home position is not above the wafer 40. As illustrated in FIG. 7 and FIG. 8, the risk of unexpected liquid drop could be avoided since the home position H is not above the wafer 40. In other words, before the operation of rotating the wafer 40 at a third rotating speed to spread the rinse solution 60 onto the wafer 40 uniformly and remove the developer solution 50 onto the wafer 40, nozzles supplying the developer solution 50 and the rinse solution 60 are not above the wafer. Therefore, the risk of unexpected liquid drop could be avoided, and defect counts which caused by unexpected liquid drop during spin coating processes can be effectively reduced. In various embodiments of the present disclosure, the third rotating speed is greater than the first rotating speed. Therefore, the wafer 40 could be effectively dried out the developer solution 50 and the rinse solution 60, which might residue on the wafer 40. For example, the third rotating speed could range from about 1500 rpm to about 2000 rpm.

According to various embodiments of the present disclosure, the method of developing includes rotating a wafer at a first rotating speed. The method further includes dispensing a developer solution onto the wafer at the first rotating speed by a first nozzle above the wafer, wherein the first nozzle moves back and forth along a path during dispensing the developer solution. The method further includes rotating the wafer at a second rotating speed to spread the developer solution onto the wafer uniformly. The method further includes dispensing a rinse solution onto the wafer at the second rotating speed by a second nozzle above the wafer.

According to various embodiments of the present disclosure, the method of developing includes rotating a wafer at a first rotating speed. The method further includes dispensing a developer solution onto the wafer at the first rotating speed, wherein the developer solution is dispensed back and forth along a linear path during dispensing the developer solution. The method further includes rotating the wafer at a second rotating speed to spread the developer solution onto the wafer uniformly. The method further includes dispensing a rinse solution onto the wafer at the second rotating speed.

According to various embodiments of the present disclosure, the tool of developing includes a spin chuck, a bowl, and a dispensing system. The spin chuck is configured to holding and rotating a wafer. The bowl surrounds the spin chuck. The dispensing system is disposed above the spin chuck, and configured to dispensing a developer solution and a rinse solution onto the wafer. The dispensing system moves back and forth along a path during dispensing the developer solution and the rinse solution, and the path is a linear path corresponds to a radius of the wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of developing, comprising:
   rotating a wafer at a first rotating speed;
   dispensing a developer solution onto the wafer at the first rotating speed by a first nozzle above the wafer, wherein the first nozzle moves back and forth along a path during dispensing the developer solution, wherein the path ranges from a center of the wafer to a point between the center of the wafer and an edge of the wafer, and a distance between the center of the wafer and the point is shorter than a radius of the wafer;
   rotating the wafer at a second rotating speed to spread the developer solution onto the wafer uniformly; and
   dispensing a rinse solution onto the wafer at the second rotating speed by a second nozzle above the wafer,
   wherein the second rotating speed is less than the first rotating speed.

2. The method of claim 1, wherein the path is a linear path corresponds to the radius of the wafer.

3. The method of claim 2, wherein the first nozzle is reciprocated between the center of the wafer and two-thirds of the radius of the wafer.

4. The method of claim 3, wherein the operation of dispensing the rinse solution is performed by the second nozzle moving back and forth along the linear path during dispensing the rinse solution.

5. The method of claim 1, after the operation of dispensing the rinse solution, further comprising:
   moving the first nozzle and the second nozzle to a home position, wherein the home position is not above the wafer; and
   rotating the wafer at a third rotating speed to spread the rinse solution onto the wafer uniformly and remove the developer solution onto the wafer.

6. The method of claim 5, wherein the third rotating speed is greater than the first rotating speed.

7. The method of claim 1, wherein the first rotating speed ranges from about 500 rpm to about 1000 rpm.

8. The method of claim 1, wherein the rinse solution is deionized water.

9. A method of developing, comprising:
   rotating a wafer at a first rotating speed;
   dispensing a developer solution onto the wafer at the first rotating speed, wherein the developer solution is dispensed back and forth along a linear path during dispensing the developer solution, wherein the linear path ranges from a center of the wafer to a point between the center of the wafer and an edge of the wafer, and a distance between the center of the wafer and the point is shorter than a radius of the wafer;

rotating the wafer at a second rotating speed for a time period to spread the developer solution onto the wafer uniformly; and dispensing a rinse solution onto the wafer at the second rotating speed, wherein the second rotating speed is less than the first rotating speed.

10. The method of claim 9, wherein the linear path corresponds to a radius of the wafer, and dispensing the developer solution is reciprocated between the center of the wafer and two-thirds of the radius of the wafer.

11. The method of claim 9, wherein the operation of dispensing the developer solution is performed by a first nozzle moving back and forth along the linear path.

12. The method of claim 11, wherein the operation of dispensing the rinse solution is performed by a second nozzle moving back and forth along the linear path.

13. The method of claim 12, after the operation of dispensing the rinse solution, further comprising:

moving the first nozzle and the second nozzle to a home position, wherein the home position is not above the wafer; and rotating the wafer at a third rotating speed to spread the rinse solution onto the wafer uniformly and remove the developer solution onto the wafer.

14. The method of claim 13, wherein the third rotating speed is greater than the first rotating speed.

15. The method of claim 14, wherein the second rotating speed is less than the first rotating speed.

16. The method of claim 13, wherein the third rotating speed ranges from about 1500 rpm to about 2000 rpm.

17. The method of claim 12, wherein dispensing the developer solution and the rinse solution is performed by a third nozzle.

18. The method of claim 9, wherein the first rotating speed ranges from about 500 rpm to about 1000 rpm.

19. The method of claim 9, wherein the second rotating speed ranges from about 600 rpm to about 1000 rpm.

* * * * *